(12) United States Patent
Farnworth et al.

(10) Patent No.: US 7,330,036 B2
(45) Date of Patent: Feb. 12, 2008

(54) ENGAGEMENT PROBES

(75) Inventors: Warren M. Farnworth, Nampa, ID (US); Malcolm Grief, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/632,273

(22) Filed: Jul. 31, 2003

(65) Prior Publication Data

US 2004/0021476 A1  Feb. 5, 2004

Related U.S. Application Data

(60) Division of application No. 10/057,711, filed on Jan. 24, 2002, now Pat. No. 6,670,819, which is a division of application No. 09/411,139, filed on Oct. 1, 1999, now Pat. No. 6,657,450, which is a division of application No. 09/267,990, filed on Mar. 12, 1999, now Pat. No. 6,380,754, which is a division of application No. 08/895,764, filed on Jul. 17, 1997, now Pat. No. 6,127,195, which is a continuation of application No. 08/621,157, filed on Mar. 21, 1996, now abandoned, which is a continuation of application No. 08/206,747, filed on Mar. 4, 1994, now Pat. No. 5,523,697, which is a division of application No. 08/116,394, filed on Sep. 3, 1993, now Pat. No. 5,326,428.

(51) Int. Cl.
*G01R 31/02* (2006.01)

(52) U.S. Cl. ................................ 324/754; 324/765

(58) Field of Classification Search ................ 324/754, 324/755, 757, 758, 761, 765; 361/748, 760, 361/767, 768, 771, 777, 779; 174/255, 260, 174/261, 267

See application file for complete search history.

(56) References Cited

U.S. PATENT DOCUMENTS 3,412,456 A    11/1968    Ebisawa
3,469,019 A    9/1969    Reinmann (Continued)

FOREIGN PATENT DOCUMENTS

EP           329314         8/1989

(Continued)

OTHER PUBLICATIONS

Moto's Nakano "A Probe for Testing Semiconductor Integrated Circuits and a Test Method Using Said Probe." Mar. 25, 1991 Japanese Patent Office Disclosure No. Hei 3-69131, Filing No. Hei 1-205301, Filing Date Aug. 8, 1989.

*Primary Examiner*—Ha Tran Nguyen
*Assistant Examiner*—Richard M. Isla-Rodas
(74) *Attorney, Agent, or Firm*—Wells St. John

(57) ABSTRACT

An engagement probe for engaging electrically conductive test pads on a semiconductor substrate having integrated circuitry for operability testing thereof includes an outer surface comprising a grouping of a plurality of electrically conductive projecting apexes positioned in proximity to one another to engage a single test pad on a semiconductor substrate.

26 Claims, 10 Drawing Sheets

U.S. PATENT DOCUMENTS

| | | | |
|---|---|---|---|
| 4,105,970 A | 8/1978 | Katz | |
| 4,116,523 A | 9/1978 | Coberly et al. | |
| 4,141,055 A | 2/1979 | Berry et al. | |
| 4,182,781 A | 1/1980 | Hooper et al. | |
| 4,189,825 A | 2/1980 | Robillard et al. | |
| 4,312,117 A | 1/1982 | Robillard et al. | |
| 4,315,984 A | 2/1982 | Okazaki et al. | |
| 4,417,206 A | 11/1983 | Stowers | |
| 4,499,656 A | 2/1985 | Fabian et al. | |
| 4,520,314 A * | 5/1985 | Asch et al. | 324/762 |
| 4,566,184 A | 1/1986 | Higgins et al. | |
| 4,571,540 A | 2/1986 | Stowers et al. | |
| 4,585,991 A | 4/1986 | Reid et al. | |
| 4,700,132 A * | 10/1987 | Yarbrough et al. | 324/761 |
| 4,862,243 A * | 8/1989 | Welch et al. | 257/529 |
| 4,881,118 A | 11/1989 | Niwayama et al. | |
| 4,924,589 A | 5/1990 | Leedy | |
| 4,929,999 A | 5/1990 | Hoeberechts et al. | |
| 4,937,653 A | 6/1990 | Blonder et al. | |
| 4,952,272 A | 8/1990 | Okino et al. | |
| 4,963,225 A | 10/1990 | Lehman-Lamer | |
| 5,014,161 A | 5/1991 | Lee et al. | |
| 5,032,541 A | 7/1991 | Sakamoto et al. | |
| 5,045,780 A | 9/1991 | Swart | |
| 5,072,116 A | 12/1991 | Kawade et al. | |
| 5,103,557 A | 4/1992 | Leedy | |
| 5,137,461 A | 8/1992 | Bindra et al. | |
| 5,172,050 A | 12/1992 | Swapp | 324/999.999 |
| 5,177,438 A | 1/1993 | Littlebury et al. | |
| 5,177,439 A | 1/1993 | Liu et al. | |
| 5,196,251 A | 3/1993 | Bakhru et al. | |
| 5,201,992 A | 4/1993 | Marcus et al. | 156/643 |
| 5,206,585 A | 4/1993 | Chang et al. | |
| 5,235,140 A | 8/1993 | Reele et al. | |
| 5,239,260 A | 8/1993 | Widder et al. | |
| 5,245,135 A | 9/1993 | Schreiber et al. | |
| 5,262,718 A | 11/1993 | Svendsen et al. | |
| 5,307,561 A | 5/1994 | Feigenbaum et al. | |
| 5,323,035 A | 6/1994 | Leedy | |
| 5,326,428 A | 7/1994 | Farnworth et al. | |
| 5,334,804 A | 8/1994 | Love et al. | |
| 5,353,195 A | 10/1994 | Fillion et al. | |
| 5,367,253 A | 11/1994 | Wood et al. | |
| 5,402,077 A | 3/1995 | Agahdel et al. | |
| 5,419,807 A | 5/1995 | Akram et al. | |
| 5,420,520 A | 5/1995 | Anschel et al. | |
| 5,431,328 A | 7/1995 | Chang et al. | |
| 5,468,917 A | 11/1995 | Brodsky et al. | |
| 5,471,151 A | 11/1995 | DiFrancesco | |
| 5,477,087 A | 12/1995 | Kawakita et al. | |
| 5,478,779 A | 12/1995 | Akram | |
| 5,523,697 A | 6/1996 | Farnworth et al. | |
| 5,541,525 A | 7/1996 | Wood et al. | |
| 5,559,444 A | 9/1996 | Farnworth et al. | |
| 5,580,827 A | 12/1996 | Akamine | 216/2 |
| 5,585,282 A | 12/1996 | Wood et al. | 438/613 |
| 5,625,297 A | 4/1997 | Arnaudov et al. | |
| 5,716,218 A | 2/1998 | Farnworth et al. | |
| 5,790,377 A | 8/1998 | Schreiber et al. | |
| 5,831,832 A | 11/1998 | Gillette et al. | |
| 5,838,160 A | 11/1998 | Beaman et al. | |
| 5,849,633 A | 12/1998 | Akram | |
| 5,869,787 A | 2/1999 | Akram | |
| 6,002,266 A | 12/1999 | Briggs et al. | |
| 6,093,643 A | 7/2000 | Akram | |
| 6,426,638 B1 | 7/2002 | Di Stefano | |
| 6,480,015 B2 * | 11/2002 | Akram | 324/757 |
| 6,686,758 B1 | 2/2004 | Farnworth et al. | 324/765 |

FOREIGN PATENT DOCUMENTS

| | | |
|---|---|---|
| JP | 57143838 | 9/1982 |
| JP | 2-5540 | 1/1990 |
| JP | 2232946 | 9/1990 |
| JP | 53171 | 3/1991 |
| JP | 108350 | 5/1991 |
| JP | 410446 | 1/1992 |
| JP | 3-69131 | 8/1998 |

* cited by examiner

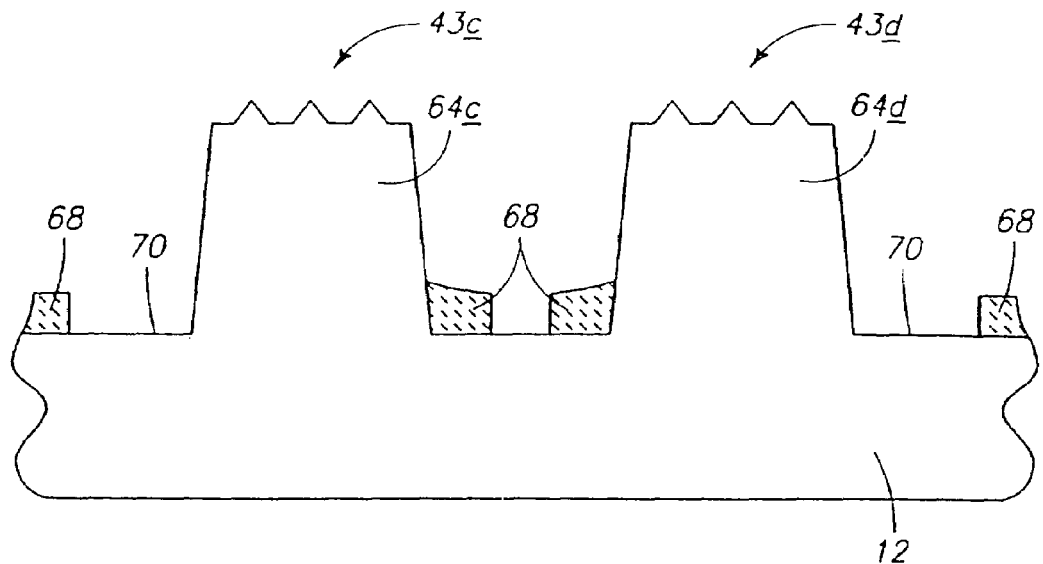
_Fig. 10_
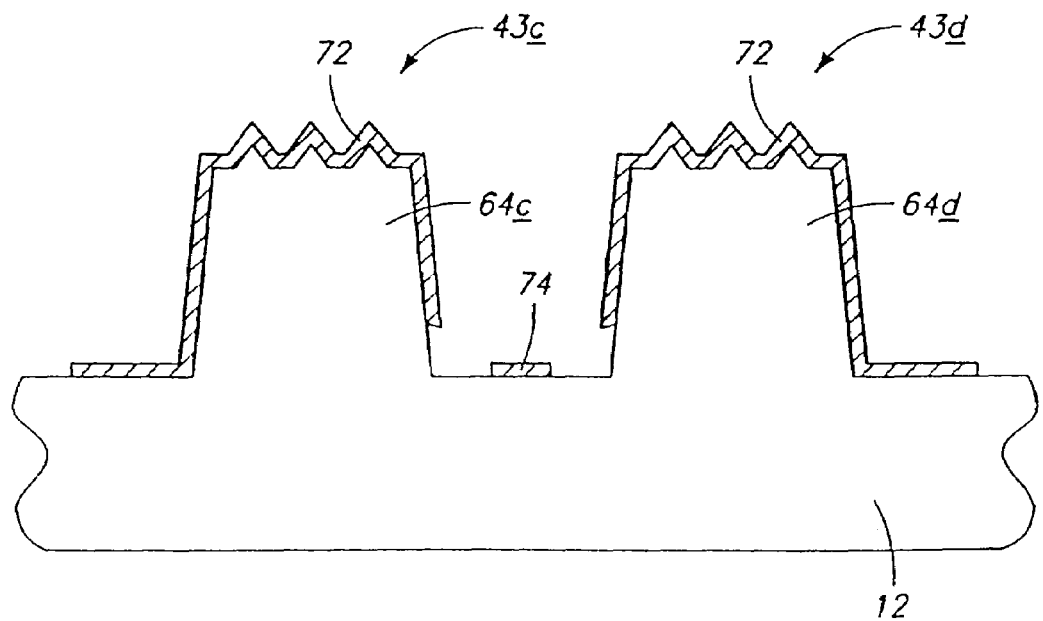
_Fig. 11_

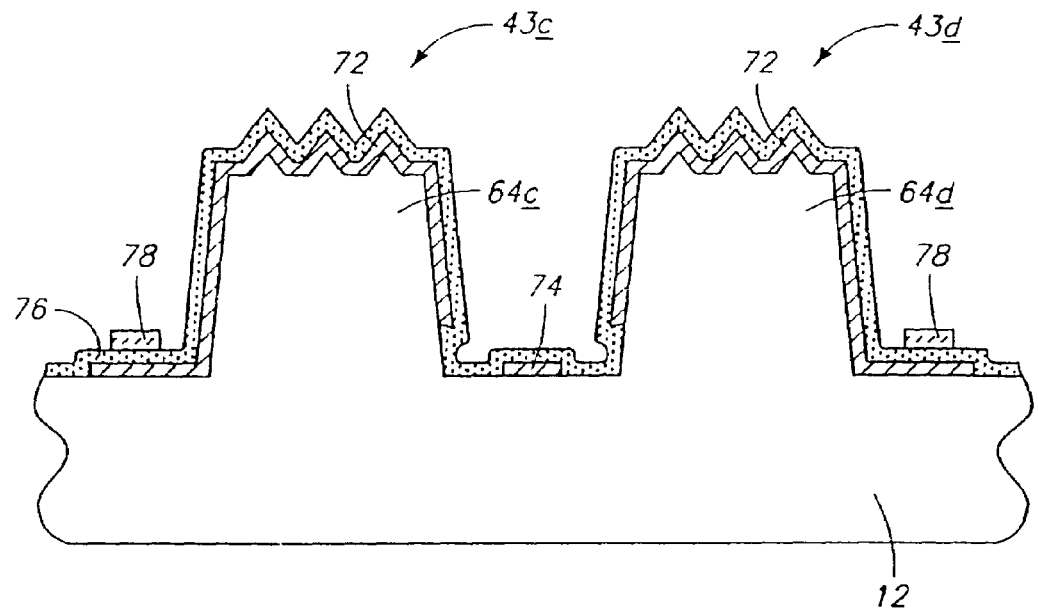
$F_IG. 12$
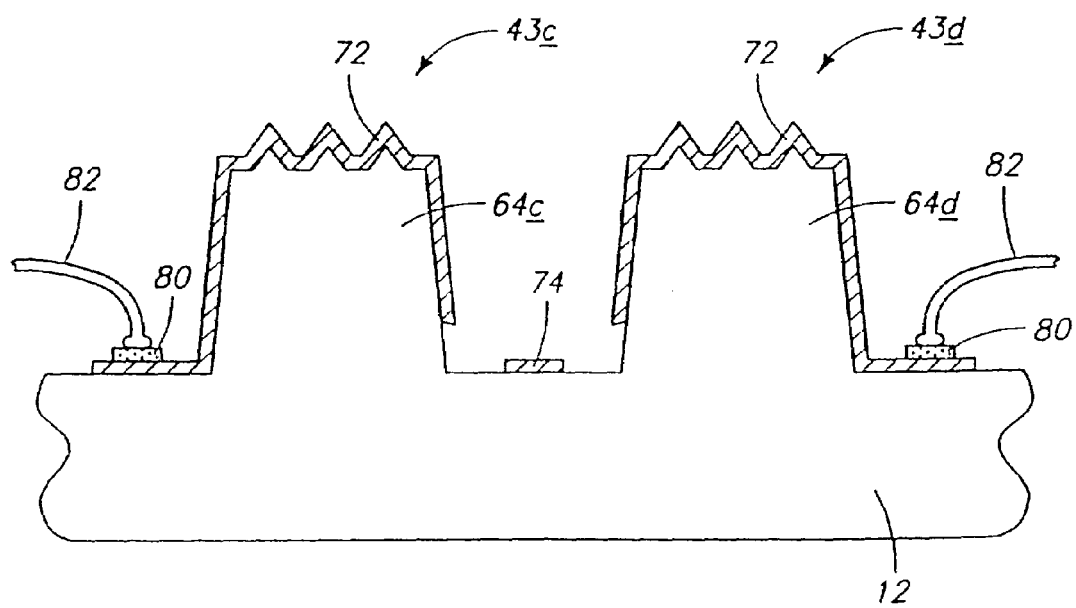
$F_IG. 13$

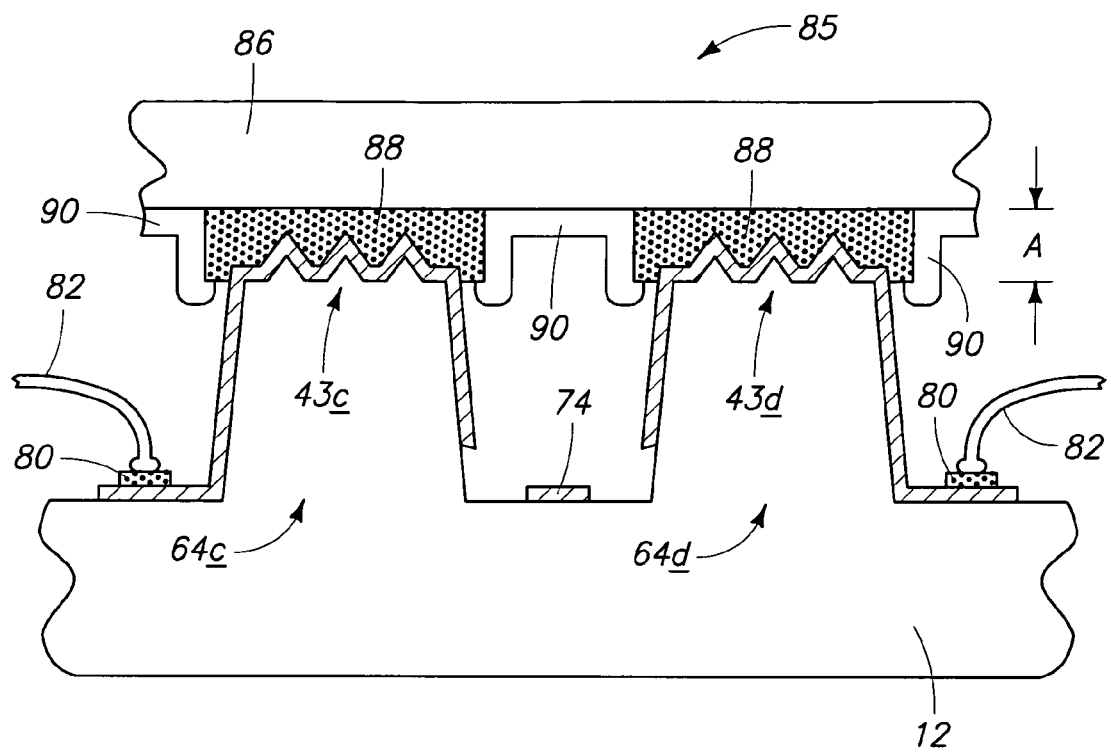
_FIG. 14_
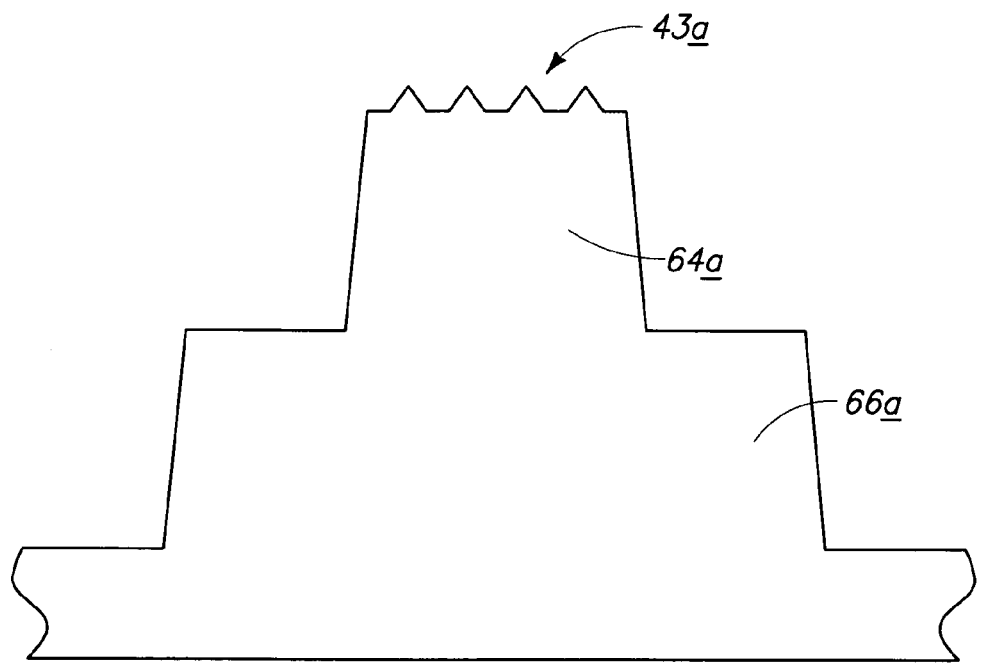
_FIG. 15_

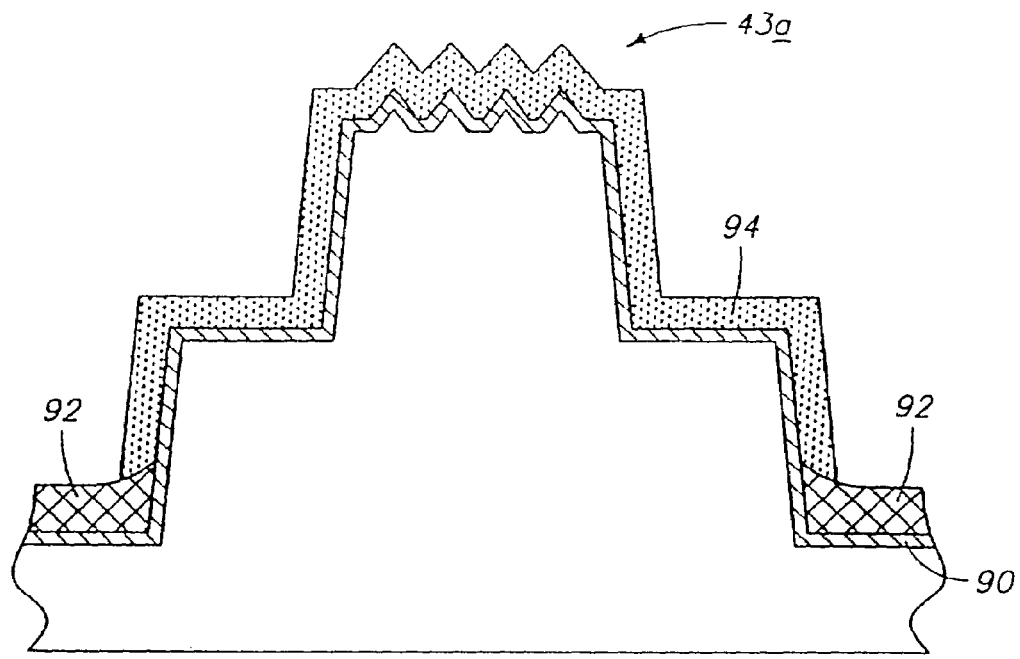
_Fig 16_
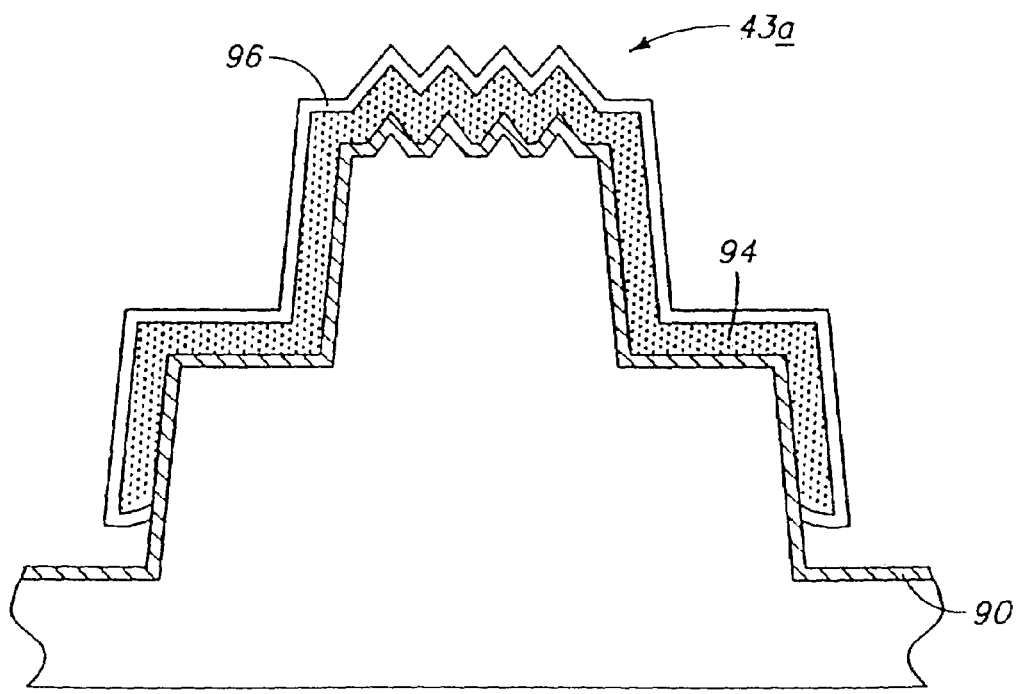
_Fig 17_

US 7,330,036 B2

ENGAGEMENT PROBES

RELATED PATENT DATA

This patent application is a divisional application of U.S. patent application Ser. No. 10/057,711, filed Jan. 24, 2002, now U.S. Pat. No. 6,670,819, which is a divisional application of U.S. patent application Ser. No. 09/411,139, filed Oct. 1, 1999, now U.S. Pat. No. 6,657,450 B2, which is a divisional application of U.S. patent application Ser. No. 09/267,990, filed Mar. 12, 1999, now U.S. Pat. No. 6,380,754 B1, which is a divisional application of U.S. patent application Ser. No. 08/895,764, filed Jul. 17, 1997, now U.S. Pat. No. 6,127,195, which is a continuation of U.S. patent application Ser. No. 08/621,157, filed Mar. 21, 1996, since abandoned; which is a continuation of U.S. patent application Ser. No. 08/206,747, filed Mar. 4, 1994, now U.S. Pat. No. 5,523,697, which is a divisional of U.S. patent application Ser. No. 08/116,394, filed Sep. 3, 1993, now U.S. Pat. No. 5,326,428, the disclosures of which are incorporated by reference.

TECHNICAL FIELD

This invention relates to methods for testing semiconductor circuitry for operability, and to constructions and methods of forming testing apparatus for operability testing of semiconductor circuitry.

BACKGROUND OF THE INVENTION

This invention grew out of the needs and problems associated with multi-chip modules, although the invention will be applicable in other technologies associated with circuit testing and testing apparatus construction. Considerable advancement has occurred in the last fifty years in electronic development and packaging. Integrated circuit density has and continues to increase at a significant rate. However by the 1980's, the increase in density in integrated circuitry was not being matched with a corresponding increase in density of the interconnecting circuitry external of circuitry formed within a chip. Many new packaging technologies have emerged, including that of "multichip module" technology.

In many cases, multichip modules can be fabricated faster and more cheaply than by designing new substrate integrated circuitry. Multichip module technology is advantageous because of the density increase. With increased density comes equivalent improvements in signal propagation speed and overall device weight unmatched by other means. Current multichip module construction typically consists of a printed circuit board substrate to which a series of integrated circuit components are directly adhered.

Many semiconductor chip fabrication methods package individual dies in a protecting, encapsulating material. Electrical connections are made by wire bond or tape to external pin leads adapted for plugging into sockets on a circuit board. However, with multichip module constructions, non-encapsulated chips or dies are secured to a substrate, typically using adhesive, and have outwardly exposed bonding pads. Wire or other bonding is then made between the bonding pads on the unpackaged chips and electrical leads on the substrate.

Much of the integrity/reliability testing of multichip module dies is not conducted until the chip is substantially complete in its construction. Considerable reliability testing must be conducted prior to shipment. In one aspect, existing technology provides temporary wire bonds to the wire pads on the die for performing the various required tests. However, this is a low-volume operation and further requires the test bond wire to ultimately be removed. This can lead to irreparable damage, thus effectively destroying the chip.

Another prior art test technique uses a series of pointed probes which are aligned to physically engage the various bonding pads on a chip. One probe is provided for engaging each bonding pad for providing a desired electrical connection. One drawback with such testing is that the pins undesirably on occasion penetrate completely through the bonding pads, or scratch the bonding pads possibly leading to chip ruin.

It would be desirable to overcome these and other drawbacks associated with testing semiconductor circuitry for operability.

BRIEF DESCRIPTION OF THE DRAWINGS

Preferred embodiments of the invention are described below with reference to the following accompanying drawings.

FIG. 10 is a view of a substrate fragment processed in accordance with the invention.

FIG. 11 is a view of the FIG. 10 substrate fragment at a processing step subsequent to that shown by FIG. 10.

FIG. 12 is a view of the FIG. 10 substrate fragment at a processing step subsequent to that shown by FIG. 11.

FIG. 13 is a view of the FIG. 10 substrate fragment at a processing step subsequent to that shown by FIG. 12.

FIG. 14 is a view of the FIG. 13 substrate in a testing method in accordance with the invention.

FIG. 15 is a view of a substrate fragment processed in accordance with the invention.

FIG. 16 is a view of the FIG. 15 substrate fragment at a processing step subsequent to that shown by FIG. 15.

FIG. 17 is a view of the FIG. 15 substrate fragment at a processing step subsequent to that shown by FIG. 16.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of engaging electrically conductive test pads on a semiconductor substrate having integrated circuitry for operability testing thereof comprises the following sequential steps:

providing an engagement probe having an outer surface comprising a grouping of a plurality of electrically conductive projecting apexes positioned in proximity to one another to engage a single test pad on a semiconductor substrate;

engaging the grouping of apexes with the single test pad on the semiconductor substrate; and sending an electric signal between the grouping of apexes and test pad to evaluate operability of integrated circuitry on the semiconductor substrate.

In accordance with another aspect of the invention, a method of forming a testing apparatus for engaging electrically conductive test pads on a semiconductor substrate having integrated circuitry for operability testing thereof, comprises the following steps:

providing a locally substantially planar outer surface of a first material on a semiconductor substrate;

providing a layer of second material atop the substantially planar outer surface of first material, the second material being capable of substantially masking the underlying first material;

patterning and etching the layer of second material to selectively outwardly expose the first material and define a grouping of discrete first material masking blocks, the discrete first material masking blocks of the grouping having respective centers, the respective centers of the grouping being positioned in sufficient proximity to one another such that the centers of the grouping fall within confines of a given single test pad which the apparatus is adapted to electrically engage;

forming projecting apexes beneath the masking blocks at the masking block centers, the projecting apexes forming a group falling within the confines of the given single test pad of which the apparatus is adapted to electrically engage;

removing the discrete first material masking blocks from the substrate after the exposing step; and rendering the projecting apexes electrically conductive.

In accordance with yet another aspect of the invention, a testing apparatus for engaging electrically conductive test pads on a semiconductor substrate having integrated circuitry for operability testing thereof comprises:

a test substrate; and an engagement probe projecting from the test substrate to engage a single test pad on a semiconductor substrate having integrated circuitry formed in the semiconductor substrate, the engagement probe having an outer surface comprising a grouping of a plurality of electrically conductive projecting apexes positioned in sufficient proximity to one another to collectively engage the single test pad.

Figure 1:
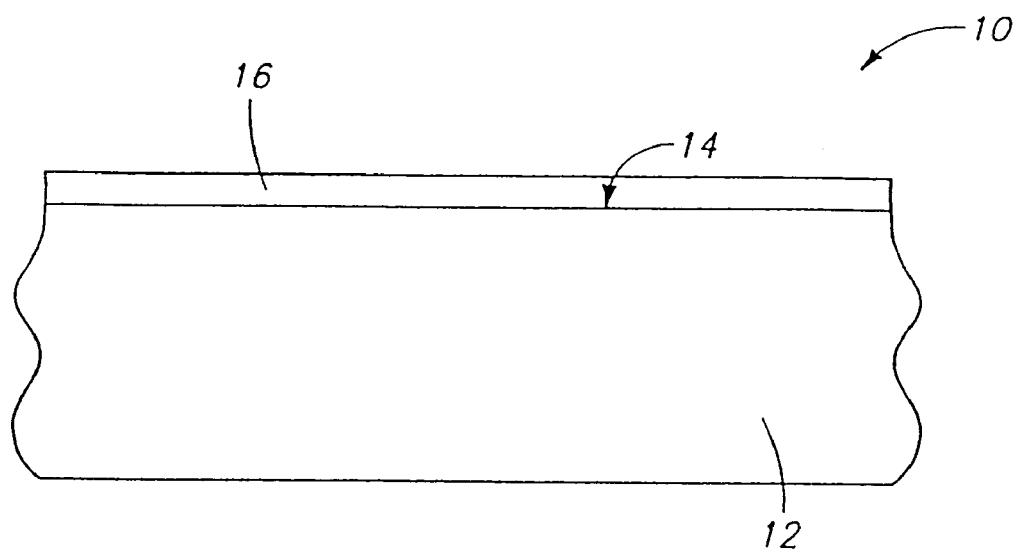
FIG. 1 is a diagrammatic representation of a fragment of a substrate processed in accordance with the invention.

The discussion proceeds initially with description of methods for forming testing apparatus in accordance with the invention, and to testing apparatus construction. FIG. 1 illustrates a semiconductor substrate fragment 10 comprised of a bulk substrate 12, preferably constituting monocrystalline silicon. Substrate 12 includes a locally substantially planar outer surface 14 comprised of a first material. In a preferred and the described embodiment, the first material constitutes the material of bulk substrate 12, and is accordingly silicon. A layer 16 of second material is provided atop the planar outer surface 14 of the first material. The composition of the second material is selected to be capable of substantially masking the underlying first material from oxidation when the semiconductor substrate is exposed to oxidizing conditions. Where the underlying first material comprises silicon, an example and preferred second material is $Si_3N_4$. A typical thickness for layer 16 would be from about 500 Angstroms to about 3000 Angstroms, with about 1600 Angstroms being preferred.

Figure 2:
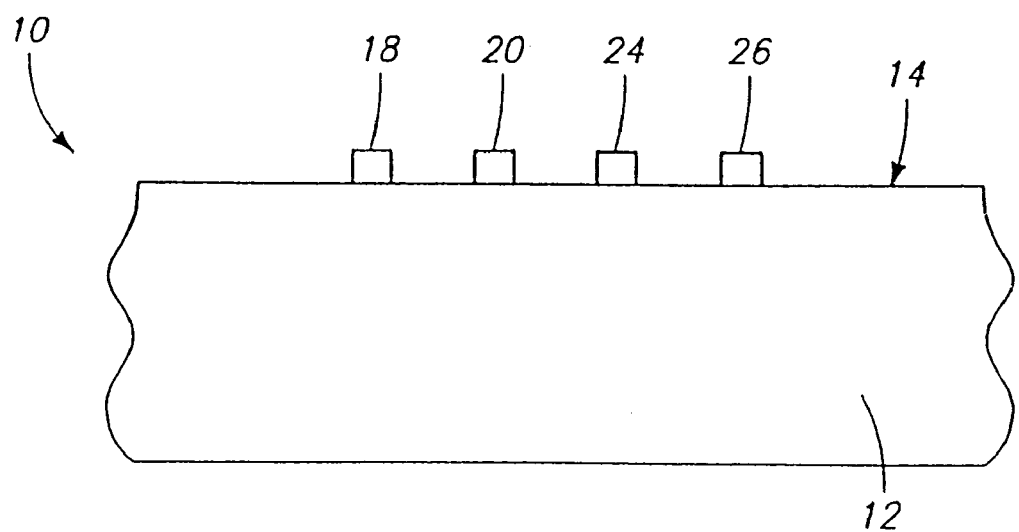
FIG. 2 is a view of the FIG. 1 substrate fragment at a processing step subsequent to that shown by FIG. 1.
Figure 3:
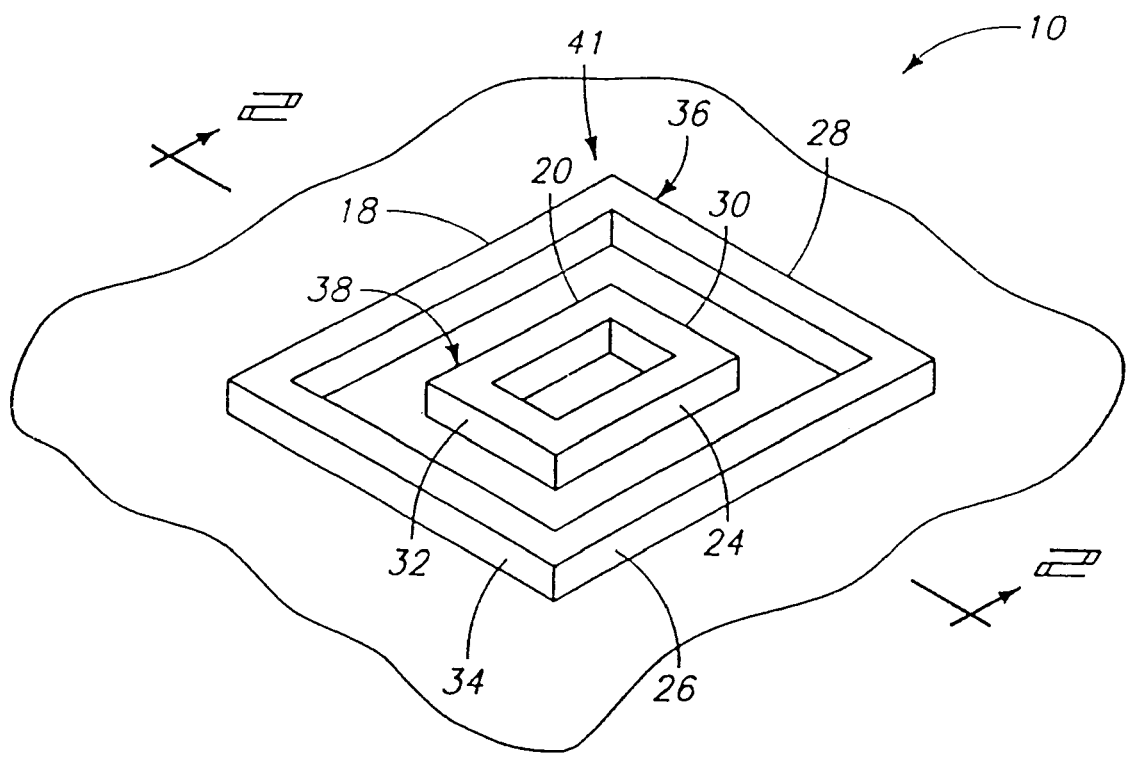
FIG. 3 is a perspective view of the FIG. 2 substrate fragment.

Referring to FIGS. 2 and 3, second material layer 16 is patterned and etched to selectively outwardly expose the first material and define a grouping of discrete first material masking blocks 18, 20, 24 and 26. For purposes of the continuing discussion, the discrete first material masking blocks of the grouping have respective centers. The lead lines in FIG. 2 depicting each of blocks 18, 20, 22 and 24 point directly to the lateral centers of the respective blocks. The respective centers of the grouping are positioned in sufficient proximity to one another such that the centers of the grouping will fall within the confines of a given single test pad of which the apparatus is ultimately adapted to electrically engage for test. Such will become more apparent from the continuing discussion.

As evidenced from FIG. 3, masking blocks 18, 20, 24 and 26 are patterned in the form of lines or runners integrally joined with other masking blocks/lines 28, 30, 32 and 34. The blocks/lines interconnect as shown to form first and second polygons 36, 38, with polygon 38 being received entirely within polygon 36. Polygons 36 and 38 constitute a grouping 41 masking blocks the confines of which fall within the area of a given single test pad of which the apparatus is ultimately adapted to electrically engage for test.

Figure 4:
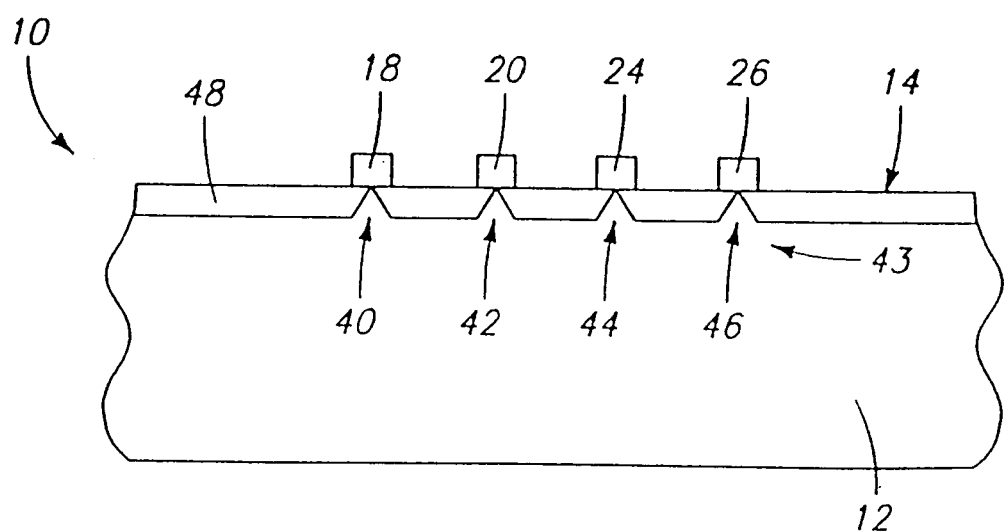
FIG. 4 is a view of the FIG. 1 substrate fragment at a processing step subsequent to that shown by FIG. 2.

Referring to FIG. 4, semiconductor substrate 10 is exposed to oxidizing conditions effective to oxidize the exposed outer surfaces of first material. Such oxidizes a sufficient quantity of first material in a somewhat isotropic manner to form projecting apexes 40, 42, 44 and 46 forming a group 43 which, as a result of the patterning of the preferred nitride layer 16, fall within the confines of the given single test pad of which the apparatus is adapted to electrically engage. Such produces the illustrated oxidized layer 48. Example oxidizing conditions to produce such effect would be a wet oxidation, whereby oxygen is bubbled through $H_2O$ while the substrate is exposed to 950° C.

Figure 5:
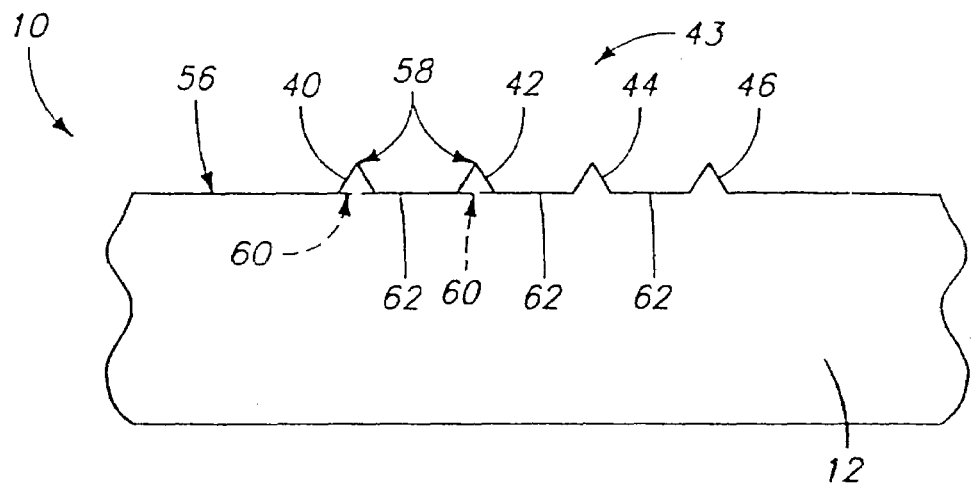
FIG. 5 is a view of the FIG. 1 substrate fragment at a processing step subsequent to that shown by FIG. 4.
Figure 6:
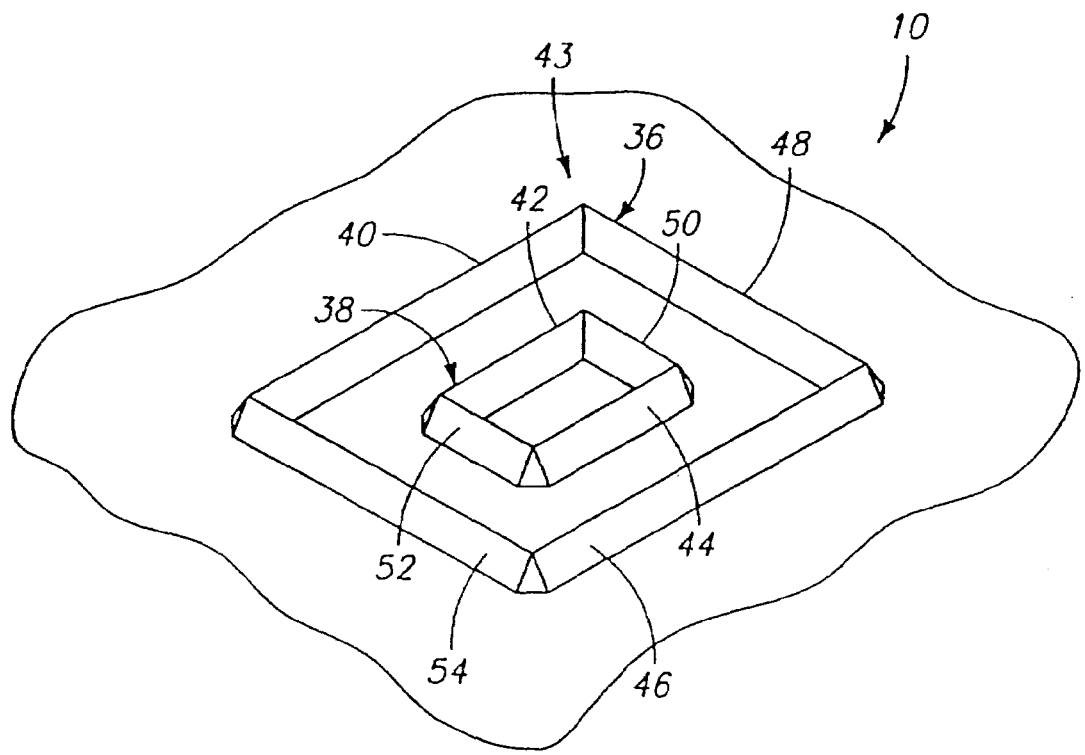
FIG. 6 is a perspective view of the FIG. 5 substrate fragment.

Referring to FIG. 5, the oxidized first material 48 is stripped from the substrate. Example conditions for conducting such stripping would include a hot $H_3PO_4$ wet etch. Thereafter, the discrete first material masking blocks 18, 20, 24, 26, 28, 30, 32 and 34 are removed from the substrate. An example condition for such stripping in a manner which is selective to the underlying silicon apexes include a room temperature HF wet etch. Thus referring to FIG. 6, the steps of patterning and etching, exposing, and stripping form projecting apexes beneath the masking blocks at the masking block centers, such projecting apexes being numbered 40, 42, 44, 46, 48, 50, 52 and 54, which are in the form of multiple knife-edge lines. The knife-edge lines interconnect to form the illustrated polygons 36 and 38. The apexes and correspondingly knife-edged or pyramid formed polygons are sized and positioned in sufficient proximity to fall within the confines of a single test pad of which the apparatus is adapted to engage, as will be more apparent from the continuing discussion.

Other ways could be utilized to form projecting apexes beneath the masking blocks at the masking block centers. As but one example, a wet or dry isotropic etch in place of the step depicted by FIG. 4 could be utilized. Such etching provides the effect of undercutting more material from directly beneath the masking blocks to create apexes, as such areas or regions have greater time exposure to etching.

Referring again to FIG. 5, the oxidation step produces the illustrated apexes which project from a common plane 56. For purposes of the continuing discussion, the apexes can be considered as having respective tips 58 and bases 60, with bases 60 being coincident with common plane 56. For clarity, tip and base pairs are numbered only with reference to apexes 40 and 42. Bases 60 of adjacent projecting apexes are spaced from one another a distance sufficient to define a penetration stop plane 62 therebetween. Example spacings between apexes would be 1 micron, while an example length of an individual stop plane would be from 3 to 10 microns. The function of penetration stop plane 62 will be apparent from the continuing discussion. A tip 58 and base 60 are provided at a projecting distance apart which is preferably designed to be about one-half the thickness of the test pad which the given apparatus is adapted to engage.

Multiple oxidizing and stripping steps might be conducted to further sharpen and shrink the illustrated projecting apexes. For example and again with reference to FIG. 4, the illustrated construction in such multiple steps would have layer 48 stripped leaving the illustrated masking blocks in place over the apexes. Then, the substrate would be subjected to another oxidation step which would further oxidize substrate first material 12, both downwardly and somewhat laterally in the direction of the apexes, thus likely further sharpening the apexes. Then, the subsequently oxidized layer would be stripped from the substrate, thus resulting in deeper, sharper projections relative from a projecting plane.

Figure 7:
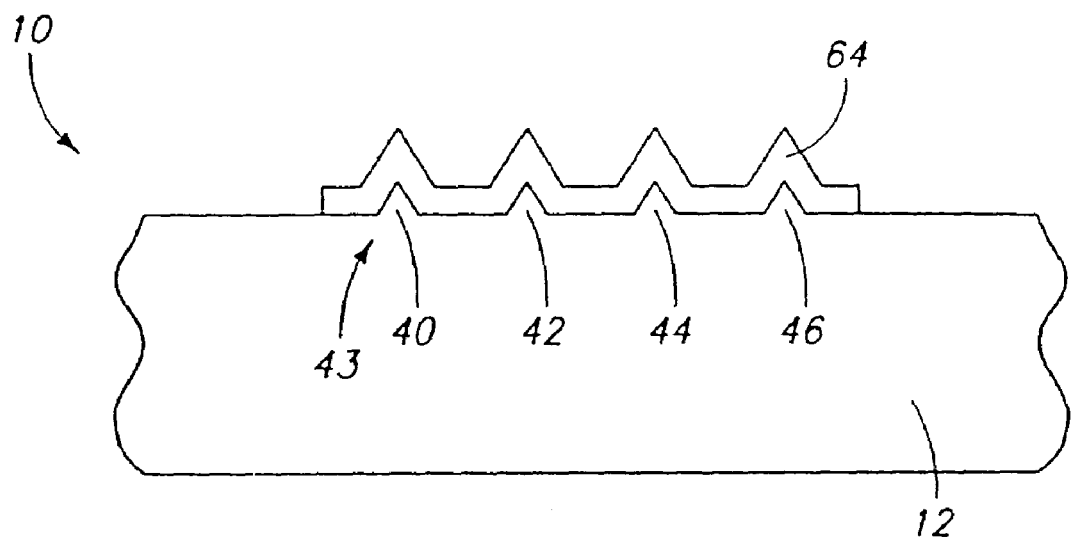
FIG. 7 is a view of the FIG. 1 substrate fragment at a processing step subsequent to that shown by FIG. 5.
Figure 8:
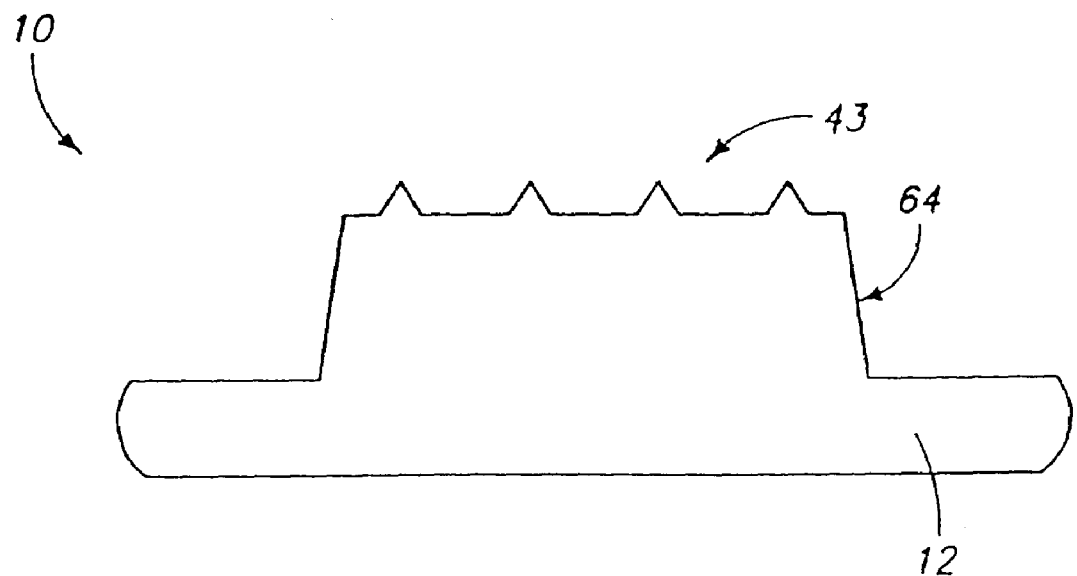
FIG. 8 is a view of the FIG. 1 substrate fragment at a processing step subsequent to that shown by FIG. 7.

Referring to FIG. 7, apex group 43 is covered a nitride masking layer 64 and photopatterned. Referring to FIG. 8, silicon substrate 12 is then etched into around the masked projecting apexes to form a projection 64 outwardly of which grouping 43 of the projecting apexes project. The masking material is then stripped.

Figure 9:
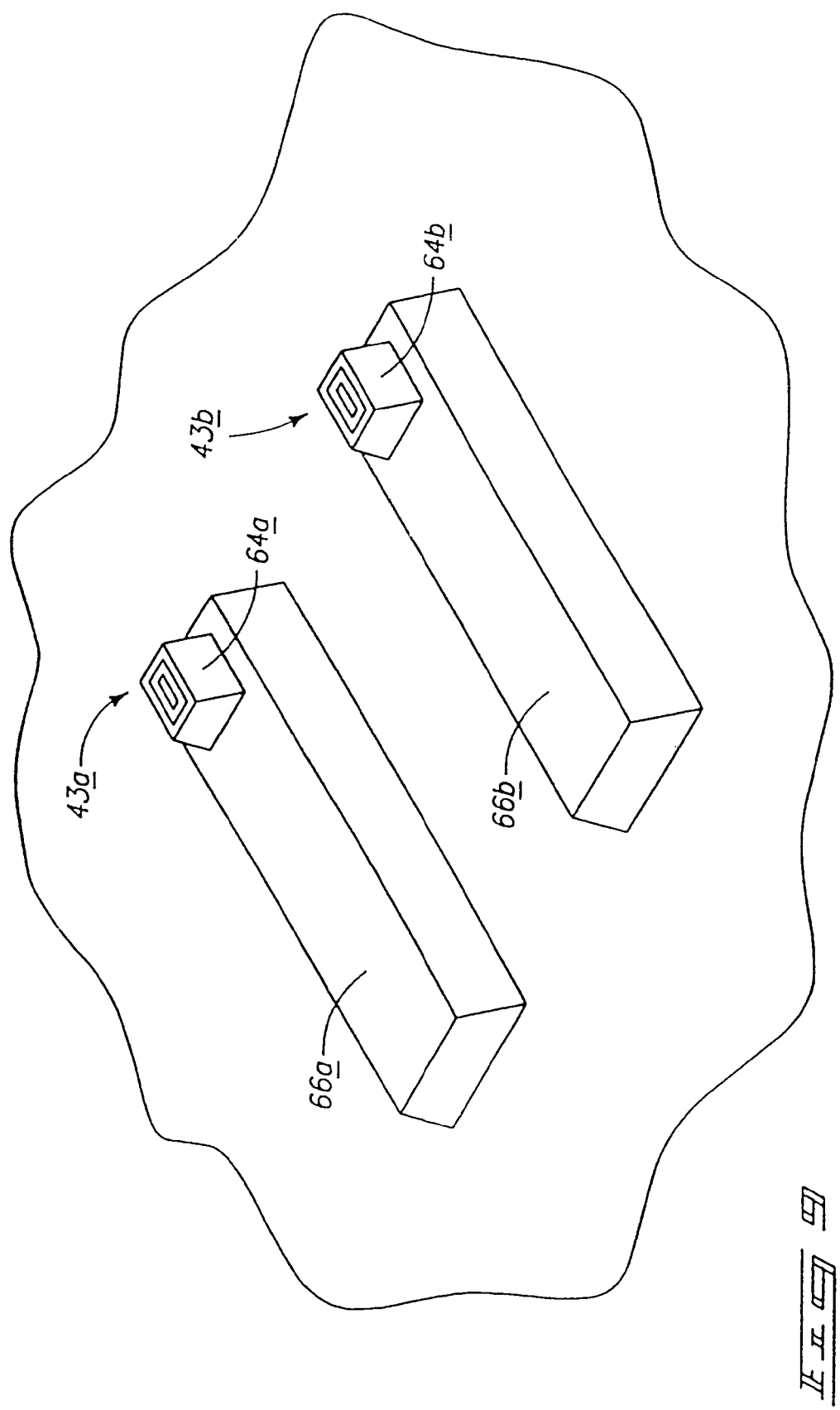
FIG. 9 is a perspective view of a substrate fragment processed in accordance with the invention.

More typically, multiple groups of projecting apexes and projections would be provided, with each being adapted to engage a given test pad on a particular chip. Further tiering for producing electrically contact-engaging probes might also be conducted. FIG. 9 illustrates such a construction having apex groups 43a and 43b formed atop respect projection 64a and 64b. A typical projecting distance from base 60 to tip 58 would be 0.5 microns, with a projection 64 being 100 microns deep and 50 microns wide. Projections 64a and 64b in turn have been formed atop elongated projections 66a and 66b, respectively. Such provides effective projecting platforms for engaging test pads as will be apparent from the continuing discussion.

Next, the group of projecting apexes is rendered electrically conductive, and connected with appropriate circuitry for providing a testing function. The discussion proceeds with reference to FIGS. 10–13 for a first example method for doing so. Referring first to FIG. 10, a substrate includes a pair of projections 64c and 64d having respective outwardly projecting apex groups 43c and 43d. A layer of photoresist is deposited atop the substrate and patterned to provide photoresist blocks 68 as shown. Photoresist applies atop a substrate as a liquid, thus filling valleys in a substrate initially and not coating outermost projections. Thus, the providing of photoresist to form blocks 68 is conducted to outwardly exposed projecting apex groups 43c and 43d, as well as selected area 70 adjacent thereto. Photoresist blocks 68 covers selected remaining portions of the underlying substrate.

Referring to FIG. 11, electric current is applied to substrate 12 to be effective to electroplate a layer of metal 72 onto outwardly exposed projecting apex groupings 43c and 43d and adjacent area 70. An example material for layer 72 would be electroplated Ni, Al, Cu, etc. An example voltage and current where substrate 12 comprises silicon would be 100V and 1 milliamp, respectively. Under such conditions, photoresist functions as an effective insulator such that metal deposition only occurs on the electrically active surfaces in accordance with electroplating techniques. Photoresist is then stripped from the substrate, leaving the FIG. 11 illustrated construction shown, which may also include a desired conductive runner 74 formed atop bulk substrate 12 between projections 64c and 64d.

The preferred material for metal layer 72 is platinum, due to its excellent oxidation resistance. Unfortunately, it is difficult to directly bond the typical copper or gold bonding wires to platinum. Accordingly, preferably an intervening aluminum bonding site is provided. Referring to FIG. 12, an aluminum or aluminum alloy layer 76 is blanket deposited atop the substrate. A layer of photoresist is deposited and patterned to provide photoresist masking blocks 78. The substrate would then be subjected to an etch of the aluminum material in a manner which was selective to the underlying platinum. Example etching conditions would include a hot $H_3PO_4$ wet etch. Such leaves resulting elevated bonding blocks 80 of aluminum atop which a bonding wire 82 is conventionally bonded, as shown in FIG. 13.

The description proceeds with reference to FIG. 14 for utilizing such an apparatus for conducting electrical tests of a chip. FIG. 14 illustrates the testing apparatus of FIG. 13 engaging a chip 85 which is being tested. Chip 85 comprises a substrate portion 86 and outwardly exposed bonding pads 88. Protecting or encapsulating material 90 is provided such that substrate 86 and circuitry associated therewith is protected, with only bonding pads 88 being outwardly exposed. Bonding pads 88 have some thickness "A".

Substrate 12 comprises a test substrate having engagement probes 64c and 64d projecting therefrom. Such include respective electrically conductive apexes groups 43c and 43d positioned in respective proximity to fall within the confines of and engage a single test pad 88 on chip 85. Such apexes are engaged with the respective test pads, as shown.

The illustrated projecting apexes actually project in to half-way into the thickness of the bonding pads, a distance of approximately one-half "A". The penetration stop surface 82 described with reference to FIG. 5 provides a stopping point for preventing the projecting points from extending further into bonding pads 85 than would be desired. In connecting the testing apparatus to chip 85, pressure would be monitored during engagement of the projecting tips relative to the pads 88. At some point during the projection, the force or back pressure against the testing apparatus would geometrically increase as the penetration stop plane reaches the outer surface of the bonding pads 88, indicating that full penetration had occurred. At this point, the testing substrate and chip 85 would be effectively electrically engaged. An electric signal would be sent between the respective grouping of apexes and respective test pads in conventional testing methods to evaluate operability of integrated circuitry formed within the semiconductor substrate 85.

Reference is made to FIGS. 15–17 for a description of an alternate method of rendering projecting apexes electrically conductive.

Starting with FIG. 15, such are sectional views taken laterally through projection 64a of FIG. 9. Referring to FIG. 16, an electrically conductive nucleation layer 90 is blanket deposited atop the apexes and substrate. An example material would be elemental nickel deposited by sputter techniques. Photoresist is then applied and patterned as shown to produce photoresist blocks 92. Thus, the nucleation layer coated projecting apexes and selected area adjacent thereto is outwardly exposed, while selected remaining nucleation layer coated portions of the substrate are coated by resist blocks 92. At this point, a current is applied to nucleation layer 90 effective to electrodeposit a layer 94, such as electroless deposited copper, to a thickness of 1 micron. Resist blocks 92 effectively insulate underlying nucleation layer 90 from depositing copper atop the resist. An example voltage and current would be 5V and 1 milliamp, respectively.

Referring to FIG. 17, the resist is then stripped from the substrate. A dry plasma etch is then conducted which selectively removes the exposed nickel nucleation layer 90 relative to copper layer 94, such that only copper over the illustrated nickel remains. Then if desired and as shown, current is applied to the nucleation layer and copper material in a manner and under conditions which electroless deposits a 2000 Angstrom thick layer 96 of, for example, platinum, palladium or iridium. Wire bonding could then be conducted apart from apexes 43a utilizing an intervening block of aluminum.

Such technique is preferable to the previously described electroless deposition method in that lower voltage and current can be utilized in the electroless deposition method where a highly conductive nucleation layer is provided atop the substrate.

Figure 18:
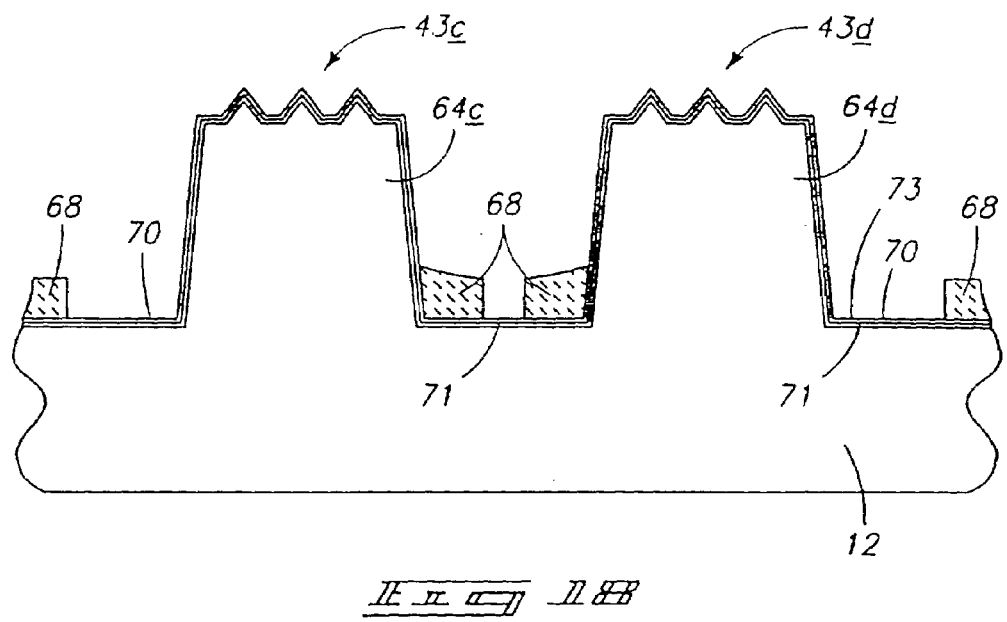
FIG. 18 is a view of a substrate fragment processed in accordance with the invention.
Figure 19:
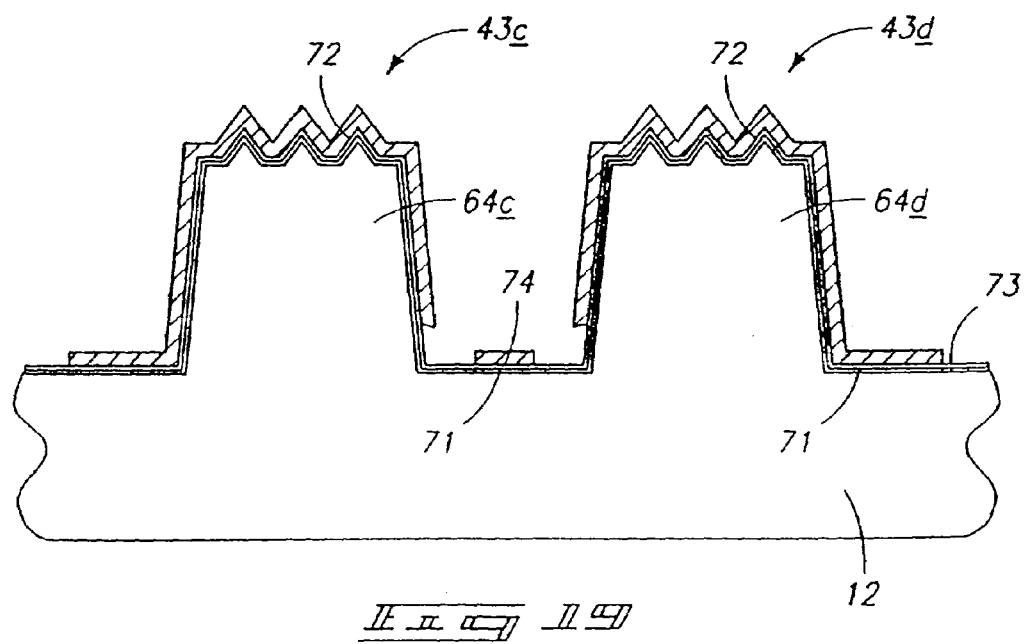
FIG. 19 is a view of the FIG. 18 substrate fragment at a processing step subsequent to that shown by FIG. 18.

Another alternate and preferred technique for forming and rendering the projecting apexes conductive is shown with reference to FIGS. 18 and 19. Such is an alternate construction corresponding to that construction shown by FIG. 10. FIG. 18 is the same as FIG. 10, but for the addition of, a) an insulating layer 71, preferably SiO$_2$; and b) a metal nucleation layer 73, prior to the providing and patterning to produce photoresist blocks 68. Such a process is preferable to that shown by FIG. 10 to provide separation of the typical monocrystalline silicon substrate 12 from direct contact with metal. FIG. 19 illustrates the subsequent preferred electroless deposition of a metal layer 72 using substrate nucleation layer 73 as a voltage source. With respect to the embodiment shown by FIGS. 15–17, such also would preferably be provided with an insulating layer prior to deposition of the nucleation layer. An alternate and preferred material for layer 73 would be aluminum metal, with the subsequently electroless layer being comprised essentially of platinum. Platinum could then be used as a masking layer to etch exposed aluminum after photoresist strip. An example etch chemistry for such etch would include a wet H$_3$PO$_4$ dip.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An engagement probe comprising:
 a substrate comprising bulk semiconductive material;
 a projection supported over the substrate and comprising material of the substrate; and
 a grouping of a plurality of projecting apexes extending from the projection; and
 wherein the apexes are in the shape of multiple knife-edge lines, the multiple knife-edge lines being positioned to form at least one polygon.

2. The engagement probe of claim 1 comprising a plurality of such groupings for engaging multiple conductive pads.

3. The engagement probe of claim 1 wherein the multiple knife-edge lines are positioned to form at least two polygons, one of which is received entirely within the other.

4. The engagement probe of claim 1 wherein the grouping of apexes is formed on the projection which is supported by another projection, the another projection extending directly from the substrate.

5. The engagement probe of claim 1 wherein the apexes have a selected projecting distance, the projecting distance being about one-half the thickness of the conductive pad which the apparatus is adapted to engage.

6. The engagement probe of claim 1 wherein the apexes project from a common plane of the projection, the apexes having respective tips and bases, the bases of adjacent projecting apexes being spaced from one another to define a penetration stop plane therebetween.

7. The engagement probe of claim 1 wherein the apexes project from a common plane of the projection, the apexes having respective tips and bases, the bases of adjacent projecting apexes being spaced from one another to define a penetration stop plane therebetween, the tips being a distance from the penetration stop plane of about one-half the thickness of the conductive pad which the apparatus is adapted to engage.

8. The engagement probe of claim 1 wherein outermost portions of the electrically conductive apexes constitute a first electrically conductive material, and wherein the conductive pads for which the probe is adapted have outermost portions constituting a second electrically conductive material; the first and second electrically conductive materials being different.

9. The engagement probe of claim 1 wherein the material of the projection is the bulk semiconductive material.

10. The engagement probe of claim 9 wherein the material of the plurality of the projecting apexes is the bulk semiconductive material.

11. The engagement probe of claim 1 wherein the plurality of the projecting apexes extend from a substantially planar uppermost surface of the projection.

12. The engagement probe of claim 1 wherein an entirety of the projection is spaced from the substrate.

13. The engagement probe of claim 1 further comprising an intermediate structure between the projection and the substrate, wherein the intermediate structure comprises a lateral dimension that is different from a lateral dimension of the substrate and a lateral dimension of the projection.

14. The engagement probe of claim 1 wherein the projection comprises a lateral dimension less than a lateral dimension of the substrate.

15. The engagement probe of claim 1 wherein the substrate comprises a wafer.

16. The engagement probe of claim 1 wherein the bulk semiconductive material comprises bulk silicon.

17. An engagement probe formed from a semiconductor material and having a grouping of a plurality of projecting apexes positioned in sufficient proximity to one another to collectively engage a single conductive pad on a semiconductor substrate; and wherein the apexes are in the shape of multiple knife-edge lines, the multiple knife-edge lines being positioned to form at least one polygon.

18. An engagement probe formed from a semiconductor material and having a grouping of a plurality of projecting apexes positioned in sufficient proximity to one another to collectively engage a single conductive pad on a semiconductor substrate; and wherein the apexes are in the shape of multiple knife-edge lines, the multiple knife-edge lines being positioned to form at least two polygons one of which is received entirely within the other.

19. An engagement probe formed from a semiconductor material and having a grouping of a plurality of projecting apexes positioned in sufficient proximity to one another to collectively engage a single conductive pad on a semiconductor substrate; and wherein the apexes are in the shape of multiple knife-edge lines, the multiple knife-edge lines interconnecting to form at least one fully enclosed polygon.

20. An engagement probe comprising:

a substrate;

a projection supported over a side of the substrate and comprising material of the substrate;

a grouping of a plurality of projecting apexes extending from the projection and positioned in sufficient proximity to one another to collectively engage a single conductive pad on a semiconductor substrate; and wherein the apexes are in the shape of multiple knife-edge lines, the multiple knife-edge lines being positioned to form at least two polygons one of which is received entirely within the other.

21. An engagement probe comprising:

a substrate;

a projection supported over a side of the substrate and comprising material of the substrate;

a grouping of a plurality of projecting apexes extending from the projection and positioned in sufficient proximity to one another to collectively engage a single conductive pad on a semiconductor substrate; and wherein the grouping of apexes is formed on the projection which is supported by another projection, the another projection extending directly from the side of the substrate.

22. An engagement probe comprising:

a substrate;

a first projection supported over the substrate and comprising material of the substrate;

a second projection over the first projection and comprising material of the substrate;

a grouping of a plurality of projecting apexes extending from the second projection and positioned in sufficient proximity to one another to collectively engage a single conductive pad on a semiconductor substrate; and wherein the apexes project from a common plane of the second projection, the apexes having respective tips and bases, the bases of adjacent projecting apexes being spaced from one another to define a penetration stop plane therebetween, the tips being a distance from the penetration stop plane of about one-half the thickness of the conductive pad which the apparatus is adapted to engage.

23. An engagement probe comprising:

a substrate;

a projection supported over the substrate and comprising material of the substrate;

a grouping of a plurality of projecting apexes extending from the projection and positioned in sufficient proximity to one another to collectively engage a single conductive pad on a semiconductor substrate;

wherein the projection comprises a lateral dimension less than a lateral dimension of the substrate; and wherein the apexes are in the shape of multiple knife-edge lines, the multiple knife-edge lines being positioned to form at least one polygon.

24. The engagement probe of claim 23 wherein the apexes are positioned to form at least two polygons one of which is received entirely within the other.

25. The engagement probe of claim 23 wherein the apexes are positioned to form the multiple knife-edge lines interconnecting to form at least one fully enclosed polygon.

26. An engagement probe comprising:

a substrate comprising bulk semiconductive material;

a projection supported over the substrate and comprising material of the substrate;

a grouping of a plurality of projecting apexes extending from the projection; and wherein the apexes are in the shape of multiple knife-edge lines, the multiple knife-edge lines interconnecting to form at least one fully enclosed polygon.

* * * * *

UNITED STATES PATENT AND TRADEMARK OFFICE
CERTIFICATE OF CORRECTION

| | | |
|---|---|---|
| PATENT NO. | : 7,330,036 B2 | Page 1 of 1 |
| APPLICATION NO. | : 10/632273 | |
| DATED | : February 12, 2008 | |
| INVENTOR(S) | : Farnworth et al. | |

It is certified that error appears in the above-identified patent and that said Letters Patent is hereby corrected as shown below:

In column 9, line 28, in Claim 20, after "over" DELETE --a side of--.

Title Page: (75) Inventors:
After "Malcolm Grief, Boise, ID (US)" INSERT --Gurtej S. Sandhu, Boise, ID (US)--.

Signed and Sealed this

Twenty-seventh Day of May, 2008

JON W. DUDAS
*Director of the United States Patent and Trademark Office*